United States Patent
Wachter et al.

(10) Patent No.: US 11,811,272 B2
(45) Date of Patent: Nov. 7, 2023

(54) ELECTRONIC MODULE HAVING A FUSE IN A POWER TOOL

(71) Applicant: Black & Decker Inc., New Britain, CT (US)

(72) Inventors: Eric W. Wachter, Baltimore, MD (US); Erik A. Ekstrom, York, PA (US)

(73) Assignee: BLACK & DECKER, INC., New Britain, CT (US)

( * ) Notice: Subject to any disclaimer, the term of this patent is extended or adjusted under 35 U.S.C. 154(b) by 298 days.

(21) Appl. No.: 17/022,806

(22) Filed: Sep. 16, 2020

(65) Prior Publication Data
US 2021/0099055 A1    Apr. 1, 2021

Related U.S. Application Data

(60) Provisional application No. 62/907,105, filed on Sep. 27, 2019.

(51) Int. Cl.

| | |
|---|---|
| *H05K 1/18* | (2006.01) |
| *H02K 11/00* | (2016.01) |
| *H02K 11/33* | (2016.01) |
| *H02K 7/14* | (2006.01) |
| *H01H 37/76* | (2006.01) |

(52) U.S. Cl.
CPC ....... *H02K 11/0094* (2013.01); *H01H 37/761* (2013.01); *H02K 7/145* (2013.01); *H02K 11/33* (2016.01); *H05K 1/181* (2013.01); *H05K 2201/10181* (2013.01)

(58) Field of Classification Search
CPC ........... H01H 37/761; H01H 2037/762; H01H 85/36; H01H 2085/0412; H01H 2085/0414; H02K 7/145; H02K 11/0094; H02K 11/33; H05K 1/181; H05K 2201/10181
See application file for complete search history.

(56) References Cited

U.S. PATENT DOCUMENTS

| | | | |
|---|---|---|---|
| 4,494,104 A | 1/1985 | Holmes | |
| 4,498,068 A * | 2/1985 | Gaia | ...................... H01H 85/38 |
| | | | 337/195 |
| 5,612,662 A | 3/1997 | Drekmeier et al. | |

(Continued)

FOREIGN PATENT DOCUMENTS

| | | |
|---|---|---|
| DE | 202010009326 U1 | 10/2011 |
| EP | 0562438 B1 | 6/1996 |

(Continued)

OTHER PUBLICATIONS

EP EESR dated, Feb. 24, 2021 in corresponding EP application 20197401.1.

*Primary Examiner* — Jacob R Crum

(57) ABSTRACT

An electronic module for a power tool having an electric motor is provided including a printed circuit board (PCB), an inverter bridge circuit, a first conductive track disposed on the PCB and coupled to the power source, a second conductive track disposed on the PCB and coupled to the inverter bridge circuit, and a fuse strap provided between the first conductive track and the second conductive track. The fuse strap includes a main body spaced apart from the PCB, a first mounting portion mounted on the first conductive track via a first solder joint, and a second mounting portion mounted on the second conductive track via a second solder joint.

15 Claims, 13 Drawing Sheets

(56) References Cited

U.S. PATENT DOCUMENTS

| | | |
|---|---|---|
| 5,770,993 A | 6/1998 | Miyazawa et al. |
| 5,793,274 A | 8/1998 | Kelly et al. |
| 6,445,276 B2 | 9/2002 | Schön et al. |
| 6,636,403 B2 | 10/2003 | McLoughlin et al. |
| 6,737,770 B2 | 5/2004 | Sunaga et al. |
| 6,876,533 B1 | 4/2005 | Ryan |
| 8,302,883 B2 | 11/2012 | Short |
| 8,564,242 B2 | 10/2013 | Hansford et al. |
| 9,142,992 B2 | 9/2015 | Malackowski et al. |
| 9,419,462 B2 | 8/2016 | Sollanek |
| 9,443,683 B2 | 9/2016 | Hrnicko et al. |
| 2004/0037044 A1* | 2/2004 | Cook ................ H05K 1/0206 361/705 |
| 2007/0244471 A1 | 10/2007 | Malackowski |
| 2010/0141375 A1* | 6/2010 | Liptak ............... H05K 1/0293 337/401 |
| 2011/0050386 A1* | 3/2011 | Schlenker .......... H01H 37/761 337/407 |
| 2015/0054614 A1* | 2/2015 | Blewitt .............. H01H 85/0241 337/292 |
| 2015/0280517 A1* | 10/2015 | Ekstrom ................ B25F 5/008 361/715 |
| 2016/0155596 A1* | 6/2016 | Ziegler .............. H01H 85/0452 337/273 |
| 2017/0234484 A1* | 8/2017 | Vanko ................ B24B 23/028 173/176 |
| 2018/0076745 A1* | 3/2018 | Cox ......................... H02P 6/14 |
| 2018/0090291 A1* | 3/2018 | Jefferies ............... H01H 50/546 |
| 2018/0114657 A1* | 4/2018 | Park ..................... H01H 85/36 |

FOREIGN PATENT DOCUMENTS

| | | |
|---|---|---|
| EP | 2873493 A2 | 5/2015 |
| EP | 2873493 A3 | 12/2015 |
| EP | 3364729 A1 | 8/2018 |
| EP | 3407472 A1 | 11/2018 |
| JP | H0244705 A | 2/1990 |
| JP | H0268917 A | 3/1990 |
| JP | H02276228 A | 11/1990 |
| JP | H02276229 A | 11/1990 |
| JP | H02277223 A | 11/1990 |
| JP | H03280317 A | 12/1991 |
| JP | H03280318 A | 12/1991 |

\* cited by examiner

ELECTRONIC MODULE HAVING A FUSE IN A POWER TOOL

CROSS-REFERENCE TO RELATED APPLICATION

This application claims the benefit of U.S. Provisional Patent Application No. 62/907,105 filed Sep. 27, 2019, which is incorporated herein by reference in its entirety.

FIELD OF THE DISCLOSURE

This disclosure relates to an electric power module for a brushless motor in a power tool, and more particularly to a fuse design for an electronic power module.

BACKGROUND

Use of cordless power tools has increased dramatically in recent years. Cordless power tools provide the ease of a power assisted tool with the convenience of cordless operation. Conventionally, cordless tools have been driven by Permanent Magnet (PM) brushed motors that receive DC power from a battery assembly or converted AC power. In a PM brushed motor, commutation is achieved mechanically via a commutator and a brush system. By contrast, in a brushless DC motor, commutation is achieved electronically by controlling the flow of current to the stator windings. A brushless DC motor includes a rotor for providing rotational energy and a stator for supplying a magnetic field that drives the rotor. Comprising the rotor is a shaft supported by a bearing set on each end and encircled by a permanent magnet (PM) that generates a magnetic field. Power devices such as MOSFETs are connected in series with each winding to enable power to be selectively applied. When power is applied to a winding, the resulting current in the winding generates a magnetic field that couples to the rotor.

Use of fuses for protecting the power source and/or the power tool electronic components against high current spikes is commonplace. High current conditions may take place when there is an electrical shortage or other tool fault condition that causes the motor to draw significant amount of current in a short time. Typically, the fuse is electrically coupled on the power supply line to the power devices.

Conventional electronic fuses are suitable for most power tool applications with maximum power output of, for example, 1500 watts or below. Such power tools may operate at an operating current limit of, for example, 20 A, and can therefore be properly protected using a small electronic fuse with a constant current rating of 30 A. Common 30 A fuses have surface areas of 3-6 mm² and thus can be suitably mounted on the PCB 202 without significant design work. However, power tools producing power output levels greater than 1500 watts may require operating at current thresholds that are greater than the 30 A constant current rating of conventional small fuses, causing the fuses the open during normal operation. Fuses with higher current ratings are commonly available but are significantly larger than above-referenced fuses and not suitable for use in most power tools. Commercially available high-current fuses, such as those used in automotive applications (e.g., with a constant current rating of 60 A to 100 A) often require a mounting surface area of 2 cm² or greater, which represents a large portion of the electronic control module 200. Further, such high current fuses open at very high temperatures that are unsuitable for power tool applications. In addition, fuses are commonly soldered to circuit board along the current path of the power supply, and the solder joints are prone to melting at high currents. What is needed is a solution that accounts for all these shortcomings of existing fuses in power tool applications.

This section provides background information related to the present disclosure and is not necessarily prior art.

SUMMARY

This section provides a general summary of the disclosure and is not a comprehensive disclosure of its full scope or all of its features.

According to an embodiment, an electronic module is provided for a power tool having an electric motor. The electronic module includes a printed circuit board (PCB), an inverter bridge circuit including power switches mounted on the PCB and configured to switchably supply electric power from a power source to the electric motor, a first conductive track disposed on the PCB and coupled to the power source, a second conductive track disposed on the PCB and coupled to the inverter bridge circuit, and at least one fuse electrically coupled between the first conductive track and the second conductive track. The fuse includes a first node secured to the first conductive track via a first solder joint and a second node secured to the second conductive track via a second solder joint. A metal slug is provided and thermally coupled to the first conductive track to absorb heat from the first solder joint In an embodiment, the metal slug is mounted on the first conductive track adjacent the first solder joint.

In an embodiment, the at least one fuse includes two fuses electronically provided in parallel for a combined current rating of at least 60 Amps.

In an embodiment, a surface area of the metal slug is at least twice as large as a surface area of each of the at least one fuse.

In an embodiment, secondary slug is further provided and mounted on the second conductive track adjacent the second solder joint.

In an embodiment, the metal slug has a greater surface area than the secondary slug.

According to another embodiment of the invention, an electronic module is provided for a power tool having an electric motor. The electronic module includes a printed circuit board (PCB), an inverter bridge circuit including power switches mounted on the PCB and configured to switchably supply electric power from a power source to the electric motor, a first conductive track disposed on the PCB and coupled to the power source, a second conductive track disposed on the PCB and coupled to the inverter bridge circuit, a first metal slug mounted on the first conductive track, and a second metal slug mounted on the second conductive track. At least one fuse is provided including a first node mounted on the first metal slug and a second node mounted on the second metal slug such that the at least one fuse is spaced apart from the PCB.

In an embodiment, a first solder joint secures the first node to the first metal slug and a second solder joint secures the second node to the second metal slug.

In an embodiment, an overmold structure is disposed between at least one fuse and the PCB to secure the at least one fuse to the first metal slug and the second metal slug.

According to another embodiment of the invention, an electronic module is provided for a power tool having an electric motor. The electronic module includes a printed circuit board (PCB), an inverter bridge circuit including power switches mounted on the PCB and configured to switchably supply electric power from a power source to the electric motor, a first conductive track disposed on the PCB and coupled to the power source, a second conductive track disposed on the PCB and coupled to the inverter bridge circuit, and a fuse strap provided between the first conductive track and the second conductive track. The fuse strap includes a main body spaced apart from the PCB, a first mounting portion mounted on the first conductive track via a first solder joint, and a second mounting portion mounted on the second conductive track via a second solder joint.

In an embodiment, when current through the fuse strap exceeds a current threshold for a set amount of time, the first solder joint melts and causes the first mounting portion to detach from the first conductive track while the second solder joint continues to bond the second mounting portion to the second conductive track.

In an embodiment, wherein the first mounting portion has a greater surface area than the second mounting portion.

In an embodiment, the fuse strap has a total surface area of smaller than or equal to 100 mm^2 but is capable of sustaining current greater than 150 Amps for up to approximately 100 seconds.

In an embodiment, the main body of the fuse strap includes a curved portion configured to apply a biasing force to the first mounting portion in a direction away from the PCB.

In an embodiment, a magnet is provided at a distance from the fuse strap to apply a magnetic force to the first mounting portion in a direction away from the PCB. In an embodiment, an insulating frame disposed above the PCB configured to support the magnet.

In an embodiment, through-hole vias are provided through the first conductive track and at least partially through the PCB. When current through the fuse strap exceeds a current threshold for a set amount of time, the first solder joint melts and flows into the through-hole vias to allow the first mounting portion to detach from the first conductive track.

For any of the above configurations, in an embodiment, the motor is a brushless DC motor configured to output at least 1500 watts of power and the power source is a removable power tool battery pack.

BRIEF DESCRIPTION OF THE DRAWINGS

In the accompanying drawings which form part of the specification.

Corresponding reference numerals indicate corresponding parts throughout the several figures of the drawings.

DETAILED DESCRIPTION

Figure 1:
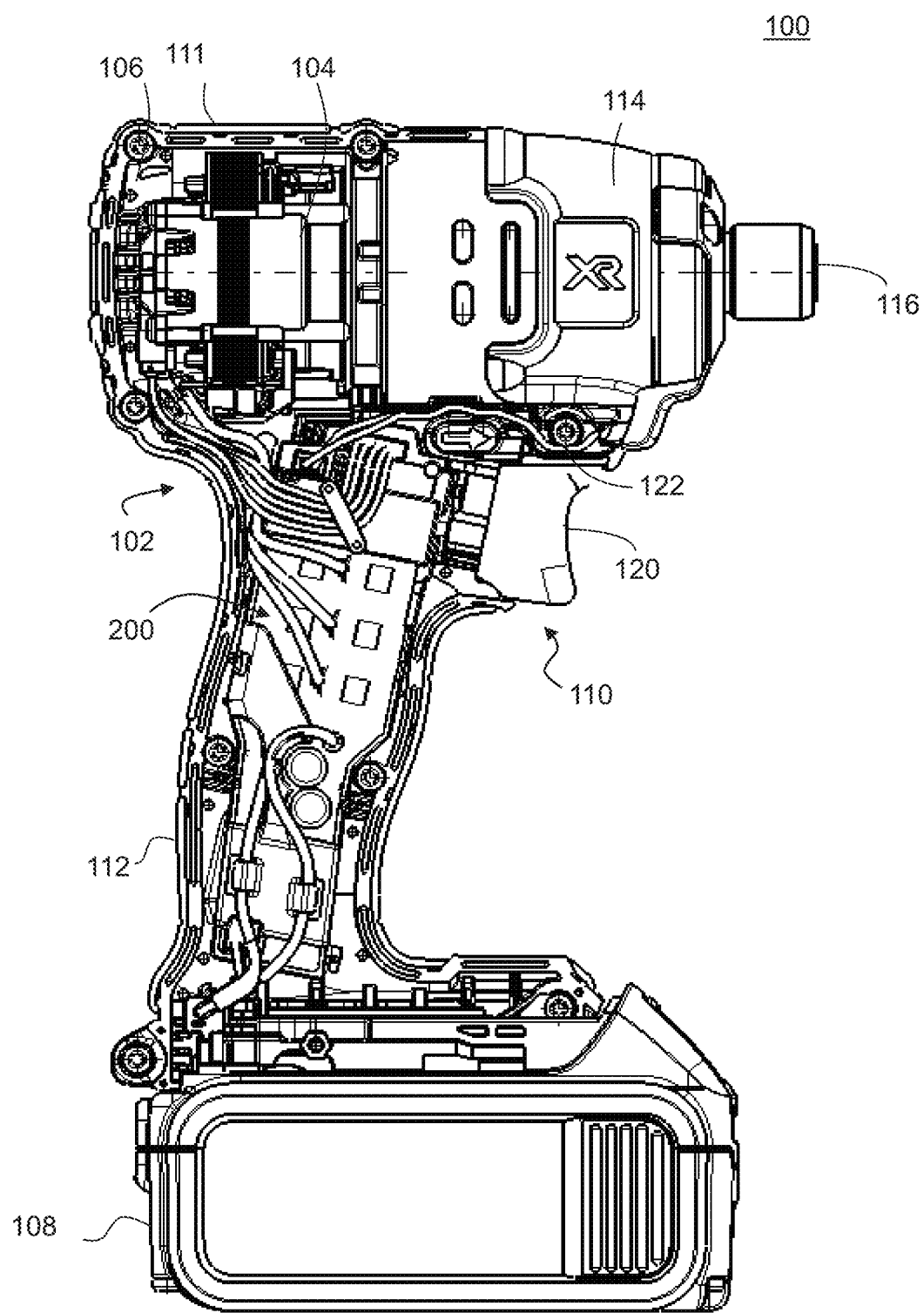
FIG. 1 depicts a longitudinal cross-sectional view of a power tool with a housing half removed, according to an embodiment.

The following description illustrates the claimed invention by way of example and not by way of limitation. The description clearly enables one skilled in the art to make and use the disclosure, describes several embodiments, adaptations, variations, alternatives, and uses of the disclosure, including what is presently believed to be the best mode of carrying out the claimed invention. Additionally, it is to be understood that the disclosure is not limited in its application to the details of construction and the arrangements of components set forth in the following description or illustrated in the drawings. The disclosure is capable of other embodiments and of being practiced or being carried out in various ways. Also, it is to be understood that the phraseology and terminology used herein is for the purpose of description and should not be regarded as limiting.

With reference to the FIG. 1, a power tool 100 constructed in accordance with the teachings of the present disclosure is illustrated in a longitudinal cross-section view. Power tool 100 in the particular example provided may be a hand-held impact driver, but it will be appreciated that the teachings of this disclosure is merely exemplary and the power tool of this invention could be any power tool. The power tool shown in FIG. 1 may include a housing 102, an electric motor 104, a battery pack 108, a transmission assembly (gear case) 114, and an output spindle 116. The gear case 114 may be removably coupled to the housing 102. The housing 102 can define a motor housing 111 and a handle 112.

According to an embodiment, motor 104 is received in motor housing 111. Motor 104 maybe be any type of motor and may be powered by an appropriate power source (electricity, pneumatic power, hydraulic power). In an embodiment, the motor is a brushless DC electric motor and is powered by a battery pack 108.

According to an embodiment of the invention, power tool 100 further includes an integrated electronic switch and control module 200 (hereinafter referred to as "electronic control module", or "control module"). Electronic control module 200, in an embodiment, may include a controller and electronic switching components for regulating the supply of power from the battery pack 108 to motor 105. In an embodiment, electronic control module 200 is disposed within the handle 112 below the motor housing 111, though it must be understood that depend on the power tool shape and specifications, electronic control module 200 may be disposed at any location within the power tool. Electronic control module may also integrally include components to support a user-actuated input unit 110 (hereinafter referred to as "input unit" 110) for receiving user functions, such as an on/off signal, variable-speed signal, and forward-reverse signal. In an embodiment, input unit 100 may include a variable-speed trigger 120, although other input mechanism such as a touch-sensor, a capacitive-sensor, a speed dial, etc. may also be utilized. In an embodiment, an on/off signal is generated upon initial actuation of the variable-speed trigger 120. In an embodiment, a forward/reverse button 122 is additionally provided on the tool 100. The forward/reverse button 122 may be pressed on either side of the tool in a forward, locked, or reverse position. In an embodiment, the associated circuitry and components of the input unit 110 that support the variable-speed trigger 120 and the forward/reverse button 122 may be fully or at least partially integrated into the electronic control module 200. Based on the input signals from the input unit 110 and associated components, the controller and electronic switching components of the electronic control module 200 modulate and regulate the supply of power from the battery pack 108 to motor 104. Details of the electronic control module 200 are discussed later in detail.

While in this embodiment, the power source is battery pack 108, it is envisioned that the teachings of this disclosures may be applied to a power tool with an AC power source. Such a power tool may include, for example, a rectifier circuit coupled to the AC power source.

It must be understood that, while FIG. 1 illustrates a power tool impact driver having a brushless motor, the teachings of this disclosure may be used in any power tool, including, but not limited to, drills, saws, nailers, fasteners, impact wrenches, grinders, sanders, cutters, etc. Also, teachings of this disclosure may be used in any other type of tool or product that include a rotary electric motor, including, but not limited to, mowers, string trimmers, vacuums, blowers, sweepers, edgers, etc.

Figure 2A:
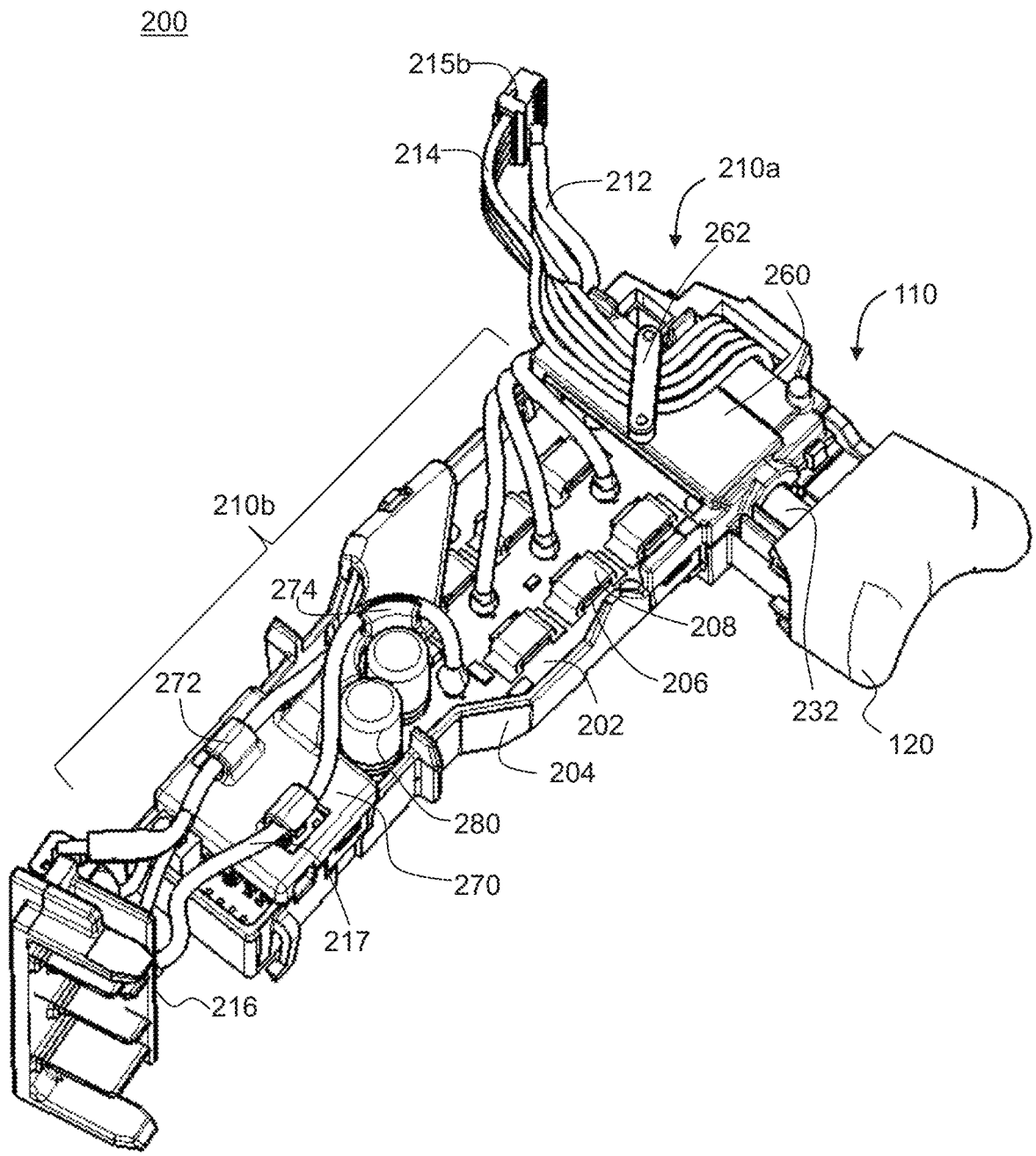
FIGS. 2A and 2B depict perspective views of an electronic control module from two different angles, according to an embodiment.
Figure 2B:
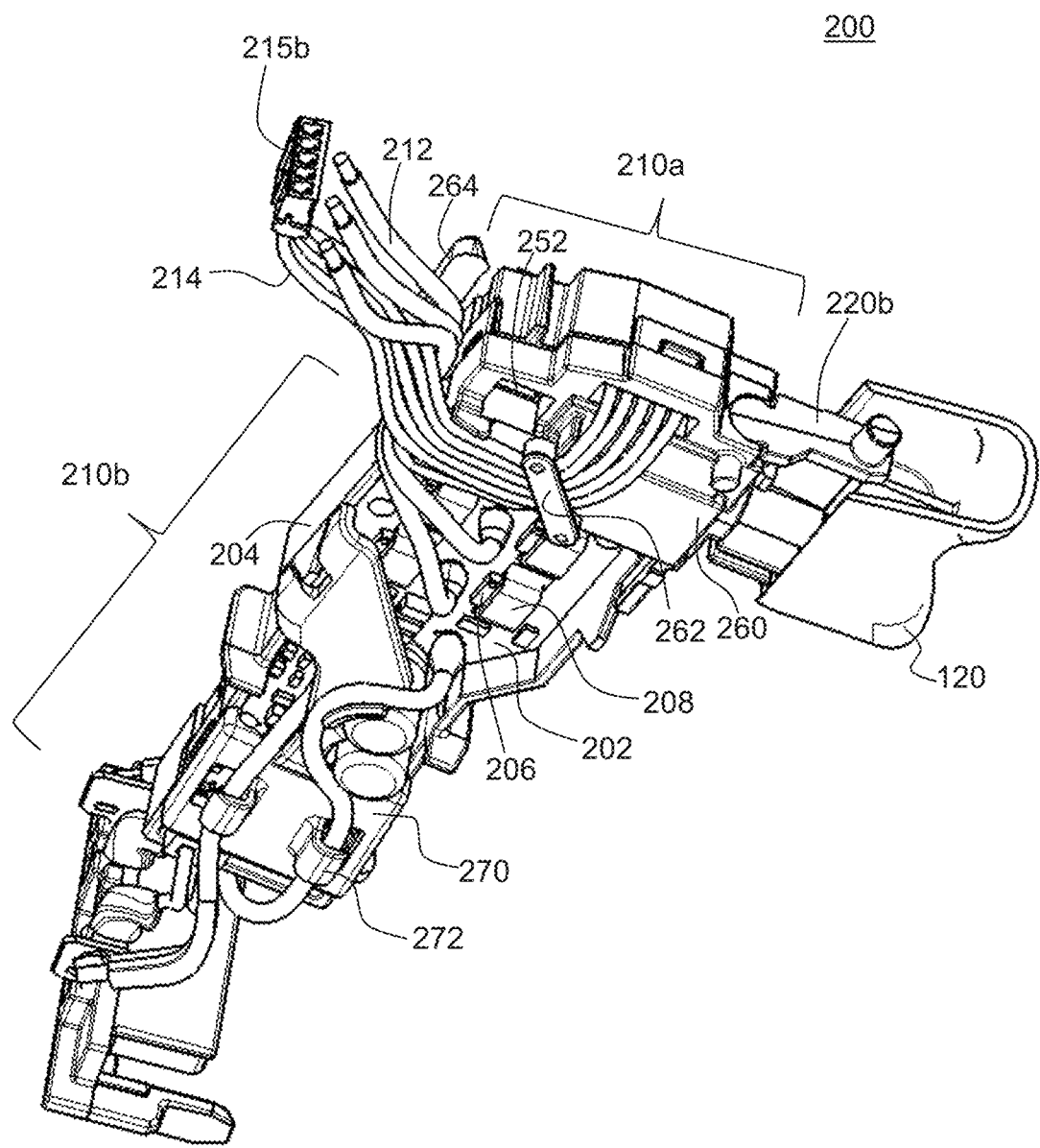
Figure 3A:
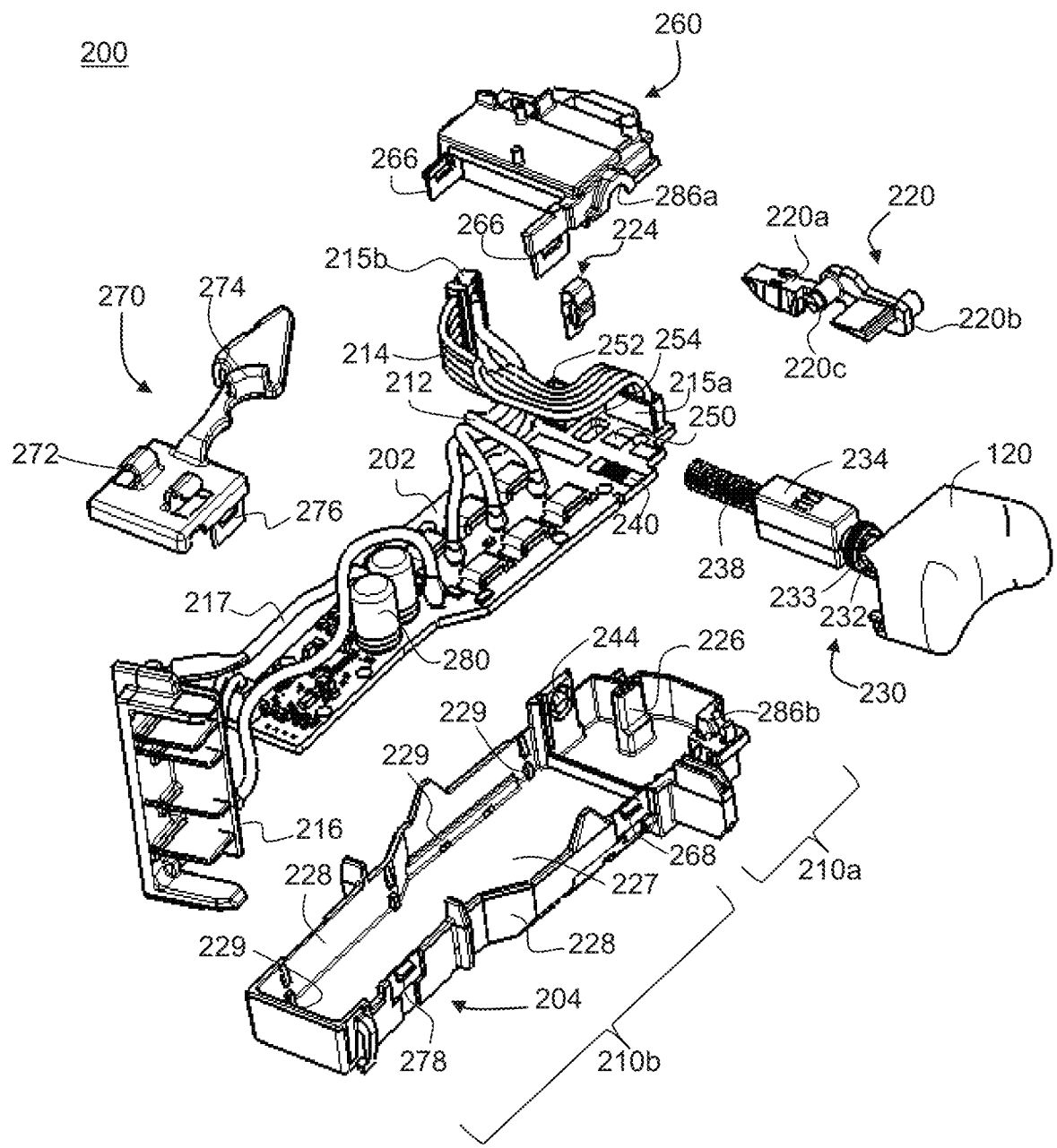
FIGS. 3A and 3B respectively depict expanded front and back perspective views of the electronic control module, according to an embodiment.
Figure 3B:
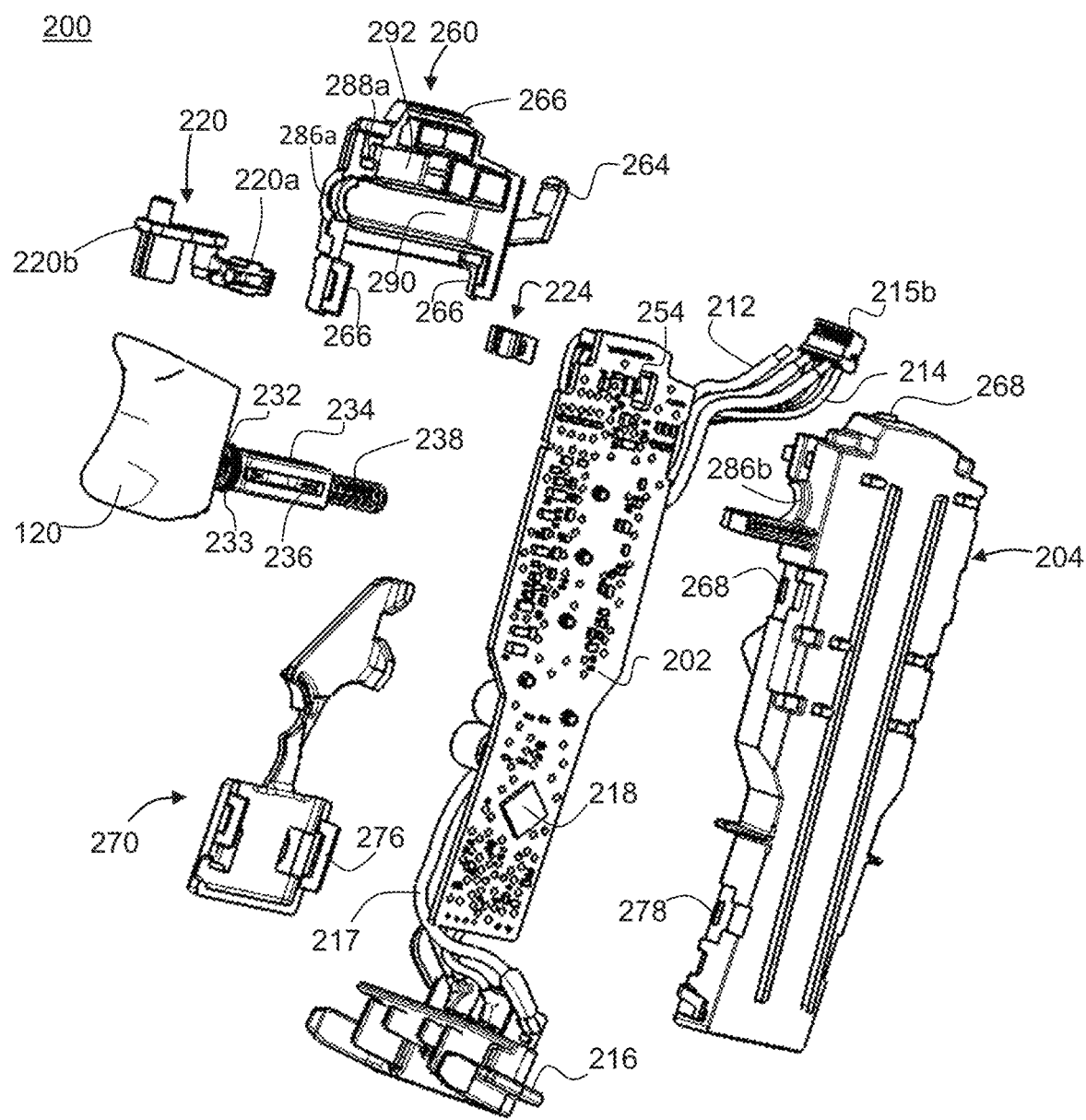

The electronic control module 200 is described herein, according to an embodiment of the invention. FIGS. 2A and 2B depict perspective views of electronic control module 200 from two different angles, according to an embodiment. FIGS. 3A and 3B depict exploded front and back views of the same module 200, according to an embodiment. Reference is made to these drawings herein.

Electronic control module 200, in an embodiment, includes a printed circuit board (PCB) 202 arranged and mounted inside a module housing 204. Module housing 204 includes a bottom surface 227, side walls 228, and an open face. PCB 202 is inserted through the open face and secured inside the module housing 204. Side walls 228 include retention features 229 for securely holding the PCB 202 at a distance from the bottom surface 227. Control module 200 includes two compartments—an enclosed compartment 210a that houses and encloses a first part of the PCB 202 and components associated with the input unit 110, as described below, and an open compartment 210b, and partially encloses a second part of the PCB 202. Within the open compartment 210b, module housing 204 encloses the lower surface and the sides of PCB 202, but leaves the upper surface of the PCB 202 substantially exposed. Mounted on the upper surface of PCB 202 are a series of power switches 206 and a series of heat sinks disposed over the power switches 206 and secured to the PCB 202. As discussed below in detail, this arrangement allows cooling air to transfer heat away from the heat sinks 208 within the power tool 100, but it protects the input unit 110 components from any dust and debris from the cooling air.

According to an embodiment, control module 200 includes a controller 218. In an embodiment, the controller may be mounted to a lower surface of the PCB 202 and be in electronic communication with the rest of the PCB 202 components through vias (not shown). In an embodiment, controller 218 may be a programmable micro-controller, micro-processor, or other processing unit capable of controlling the motor and various aspects of power tool. For example, controller 218 may be programmed to turn on and off power switches 206, as discussed below, to control commutation of the brushless motor. In an embodiment, controller 218 may be coupled to a series of gate drivers disposed on the PCB 202, which in turn are connected to the gates of the power switches 206. Alternatively, controller 218 may be a circuit chip that includes both a micro-controller and the gate drivers and be coupled directly to the gates of the power switches 206. Using the gate drivers, controller 218 turns the power switches 206 on or off selectively to commutate the motor and control the speed of the motor. Additionally, the controller may be programmed to various tool and battery pack operation features, such as tool and/or temperature control, battery pack voltage control, and tool over-current detection and control, etc. In an alternative embodiment, the controller may be an Application Specific Integrated Circuit (ASIC) configured to control the aforementioned aspects of the motor, battery, and power tool.

In an exemplary embodiment, power switches 206 may be Field Effect Transistors (FETs). In an embodiment, six power switches 206, including three high-side power switches and three low-side power switches, are arranged and coupled together as a three-phase bridge rectifier circuit. Using the gate drivers, controller 218 sequentially turns the power switches 206 on and off within each phase of the brush motor 104 commutation. Further, the controller 218 performs pulse-width modulation (PWM) of the power switches 206 within each phase to regulate the speed of the motor based on speed signals received from input unit 110, as described below. Controller 218 further controls the direction of motor commutation based on a forward/reverse signal received from input unit 110, also discussed below.

It is noted that while the power switches 206 discussed herein are FETs, other types of power switches such as BJTs or IGBTs may be utilized. Additionally, while power switches 206 are arranged as a three-phase bridge rectifier for driving a three-phase brushless motor, other number and arrangement of power switches may be used to drive other types of motors, including brushed or brushless motors.

As described above, module housing 204 leaves the upper surface of the PCB 202 exposed, thus allowing heat to dissipate from the heat sinks 208. Electronic control module 200 may be placed within a path of air flow inside the power tool, e.g., inside the power tool handle 112 in fluid communication with motor fan 106 so that airflow generated by motor fan 106 runs through the handle 112. The air flow generated within the handle further improves heat dissipation from the electronic control module 200.

In an embodiment, the PCB 202 is further potted with a layer of potting compound (not shown) in the open compartment 210b. The layer of potting compound, in an embodiment, substantially covers most of the circuit components on the PCB, but it leaves a top plate of heat sinks 206 exposed so the heat sinks 208 can dissipate heat away from the power switches 206. While the potting compound is not shown in FIGS. 2A-3B, the control module of FIG. 1 is shows with the potting compound disposed inside the housing 202.

Figure 4A:
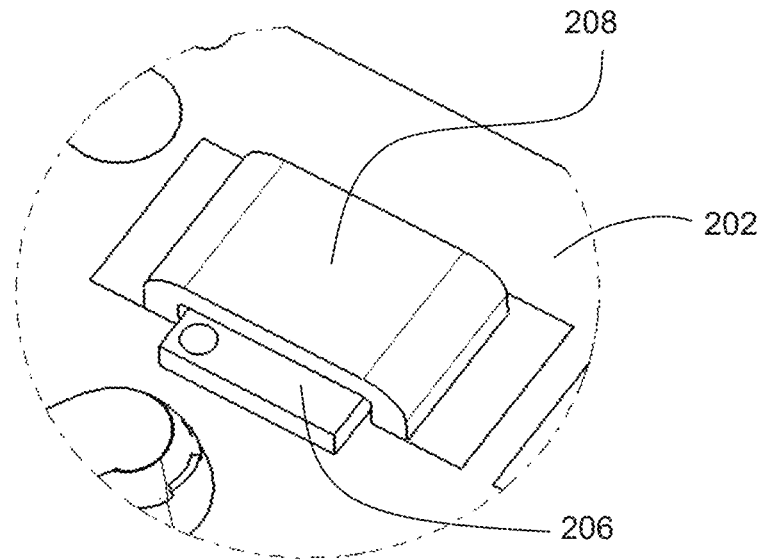
FIGS. 4A and 4B respectively depict a zoomed-in perspective view and a cross-sectional view of the electronic control module showing the arrangement of a power switch and a heat sink on a printed circuit board (PCB), according to an embodiment.
Figure 4B:
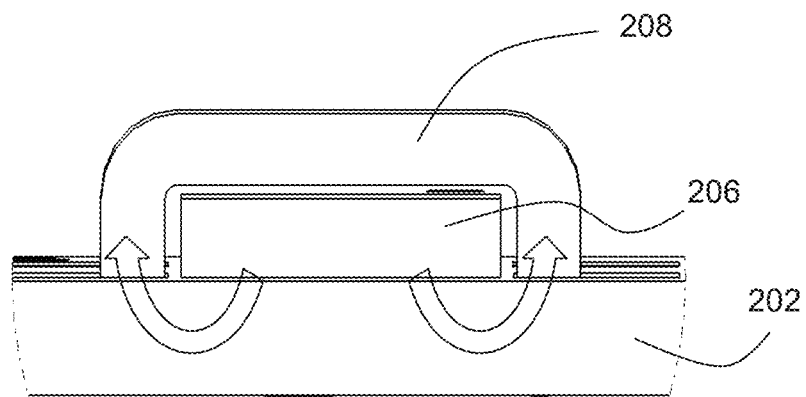

FIGS. 4A and 4B depict zoomed-in perspective and cross-sectional views of PCB 202, showing the arrangement of heat sink 208 and power switch 206 (in this case a FET) mounted over PCB 202, according to an embodiment. Heat sink 208 includes two legs mounted on the PCB 202. The main plate of heat sink 208 is located directly above power switch 206 at close proximity thereto. This allows heat to be transferred directly from power switch 206 to the heat sink 208 through a small air gap between the two. In an embodiment, the main plate of the heat sink 208 has a surface area of 10 to 40 mm$^2$, preferably 15-35 mm$^2$, more preferably 20-30 mm$^2$, that is exposed after the potting compound is applied. In addition, one or more of the legs of the heat sink 208 is electrically connected to the drain of power switch 206 on the PCB 202. This arrangement further improves heat transfer from the FET 206 to the heat sink 208.

It is noted that while in this embodiment discrete heat sinks 208 are mounted on respective power switches 206, a lower number of heat sinks 208 may be utilized instead. In an alternative embodiment of the invention, a single heat sink is mounted on the PCB over the power switches 206 to provide a higher surface area for heat transfer.

Referring back to FIGS. 2A through 3B, in an embodiment, a series of output wires 212 are secured on one end to a surface of the PCB 202. These wires connect the outputs of the power switches three-phase bridge rectifier to the power terminals the brushless motor 104. In an embodiment, a series of control signal wires 214 are also secured to a wire receptacle 215a. In an embodiment, wire receptacle 215a is mounted on the PCB and is in electrical communication with the controller 218. The control signal wires 214 allow the controller 218 to communicate with other parts of the power tool 100, such as the motor 104 and the battery 108. In an embodiment, hall signals from the brushless motor hall sensors communicate with the controller 218 through these control signal wires 214. Control signal wires 214 may additionally be provided with a control terminal 215b to ease plug-in connectivity of external wires with the control signal wires 214. In an embodiment, a pair of power input wires 217 are also secured on the surface of PCB 202. These wires are coupled to a power source (e.g., battery 108) via a power terminal 216 to supply power from the power source to the power switches 206.

In an embodiment, control module 200 includes an encapsulation member 260 that mates with the module housing 204 to form the enclosed compartment 210a of control module 200. As discussed below in detail, encapsulation member 260 protects components associated with input unit 110 from dust and debris. Encapsulation member 260 also includes wire retaining features 262 and wire guide features 264 for retaining and positioning signal wires 214 and/or power output wires 212 away from the housing 204. Encapsulation member 260 further includes mating features 266 that mate with corresponding mating features 268 on the module housing 204. In an embodiment, the mating features 268 include lips that snap fit into slots in mating features 266. In an embodiment, encapsulation member 260 further includes an opening 269 that allows control signal wires 214 to connect to PCB-side control terminal 215a.

Additionally, in an embodiment, control module 200 includes an additional cover 270 that covers a lower portion of PCB 202. Cover 270 also includes wire retaining features 272 for retaining the power wires 217, as well as wire guide features 274 for guiding the wires 217 around circuit components (e.g., capacitors 280) mounted on PCB 202. Cover 270 further includes mating features 276 that mate with corresponding mating features 278 on the module housing 204. In an embodiment, the mating features 278 include lips that snap-fit into slots in mating features 276.

In an embodiment, control module 200 is additionally provided with an auxiliary control terminal 252 mounted on a top portion of the PCB 202 that allows the controller 218 with other motor or tool components. In an embodiment, auxiliary control terminal 252 allows the controller 218 to communicate with an LED provided on the tool 100. In an embodiment, auxiliary control terminal 252 is provided outside and adjacent to the enclosed compartment 210a.

The input unit 110 is discussed herein, according to an embodiment of the invention. According to an embodiment, input unit 110 is at least partially integrated into control module 200. In an embodiment, input unit 110 incorporates electro-mechanical elements for variable-speed detection, on/off detection, and forward/reverse detection inside the enclosed compartment 210a of control module 200, as discussed herein.

In an embodiment, input unit 110 includes a forward/reverse actuator 220 supported by the enclosed compartment 210a portion of the module housing 204. In an embodiment, forward/reverse actuator 220 includes a contact member 220a, which holds an electrical connector 222 and is disposed inside the enclosed compartment 210a of the module housing 204, and an engagement member 220b, which is located outside the module housing 204. In an embodiment, engagement member 220b is in moving contact with forward/reverse button 122 on the power tool 100. A pivot member 220c located between the contact member 220a and engagement member 220b is supported by the module housing 204 and provides a pivot point for the forward/reverse actuator. A biasing member 224 is secured to the module housing 204 to engage and bias the contact member 220a in a forward, neutral (e.g., locked), or reverse direction. In an embodiment, biasing member 224 is secured in an opening of a holder, i.e. a post 226 that projects from the bottom surface 227 of the module housing 204 within the enclosed compartment 210a. In an embodiment, PCB 202 is provided with a through-hole 254 that receives the post 226. When the user presses the forward/reverse button 122 from either side of the tool to a forward, locked, or reverse position, the forward/reverse button 122 moves the engagement member 220 around the pivot portion 220c. Pivoting movement of the engagement member 220b around the pivot portion 220c causes the electrical connector 222 of contact member 220a to make or break contact with a contact-sensing member against the biasing force of the biasing member 224. In an embodiment, contact sense member includes a pair of conductive tracks 250 arranged on PCB 202.

In an embodiment, one of the conductive tracks 250 is electrically connected to power source 108 and the other is connected to and sensed by controller 218. Voltage is present and sensed by the controller 218 when electrical connector 222 makes contact with the pair of conductive tracks 250, thus electrically connecting the two conductive tracks 250. Presence or lack of sensed voltage is indicative of whether the motor should rotate in the forward or reverse direction. Functional details of use and electrical connectivity of conductive tracks 250 for forward/reserve detection are discuss in co-pending Patent Publication no. 2012/0292063 filed May 21, 2012, which is incorporated herein by reference in its entirety.

According to an embodiment, input unit 110 further includes a variable-speed actuator 230. Variable-speed actuator includes a link member 232 that extends out of the module housing 204 from a sliding member 234 that is arranged inside the module housing 204 and supports a conductive wiper 236. Link member 232 is coupled to trigger 120 that is engageable by the user. The sliding member 234 supports and engages a compression spring 238 its longitudinal end opposite link member 232. Compression spring 238 is located between an inner wall of the module housing 204 and the sliding member 234. When the user presses the trigger 120, the sliding member 234 moves against a biasing force of the spring 238.

Conductive wiper 236 contacts a speed-sensing member located on the surface of the PCB 202. In an embodiment, the speed-sensing member is a series of variable-speed conductive tracks 240 arranged on the PCB 202. Actuation of the trigger 120 moves the conductive wiper 236 over the conductive tracks 240. Initial movement of the conductive wiper 236 over the conductive tracks 240 generates a signal that turns controller 218 ON. Additionally, an analog variable-voltage signal is generated based on the movement of the conductive wiper 128 over the conductive tracks and that signal is sent to the micro-controller. This signal is indicative of the desired motor speed. Functional details of ON/OFF and variable-speed detection using conductive tracks 240 are discuss in co-pending Patent Publication no. 2012/0292063 filed May 21, 2012, which is incorporated herein by reference in its entirety. It must be understood, however, that any known variable-voltage speed-sensing mechanism, such as a resistive tape, may be a utilized within the scope of the invention.

It is noted that the moving mechanical parts of the forward/reverse actuator 220 and variable-speed actuator 230 (including the electrical connector 222 and conductive wiper 236), alone or in combination with conductive tracks 240 and 250, are referred to in this disclosure as "electromechanical" elements.

Figure 5:
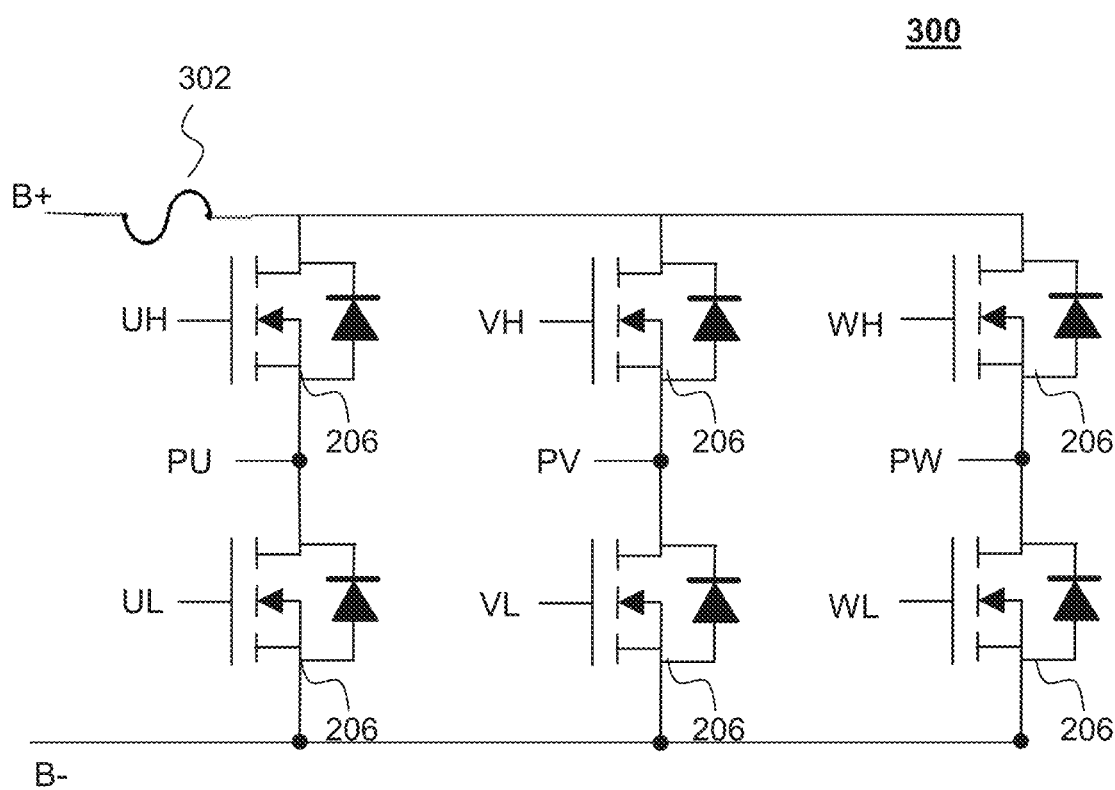
FIG. 5 depicts an exemplary power switch circuit configured as a three-phase inverter bridge, according to an embodiment.

FIG. 5 depicts an exemplary power switch circuit 300 in which the power switches 206 are configured as a three-phase inverter bridge, according to an embodiment. As shown herein, the power switches 206 include three high-side FETs and three low-side FETs. The gates of the high-side FETs driven via drive signals UH, VH, and WH generated by the controller 218, and the gates of the low-side FETs are driven via drive signals UL, VL, and WL also generated by the controller 218. In an embodiment, the sources of the high-side FETs (i.e., lower nodes of the high-side FETs in FIG. 5) are coupled to the drains of the corresponding low-side FETs (i.e., upper nodes of the low-side FETs in FIG. 5) to output power signals PU, PV, and PW. These power signals are coupled to the motor windings to energize and drive the BLDC motor 104. The drains of the high-side FETs are commonly coupled to the B+ node of the battery pack 108. Similarly, the sources of the low-side FETs are commonly coupled to the B− node of the battery pack 108.

It is noted that while N-channel MOSFETs are depicted in this example, other types of FETs (e.g., P-channel MOSFETs, JFETs, etc.) may alternatively be utilized, where the location of source and drain is different from the depicted example. Also, other types of power switches such as IGBTs may alternatively be utilized with a collector and emitter in place of a source and a drain. In principle, the configuration of the inverter bridge remains largely unchanged.

In an embodiment, electronic control module 200 may be provided with a fuse 302 on the current path of the battery pack (e.g., between B+ and the inverter bridge high-side drains) to protect the electronic control module 200 in the event of a short or failure of one of the power switches. Without a fuse 302, failure of even one of the power switches 206 may cause a short between the B+ and B− terminals of the battery pack 208 when the complimentary FET turns ON in a subsequent cycle, allowing the current to shoot through the inverter bridge. The fuse 302 has a current rating at which it opens, cutting off the path of current between the battery terminals.

Conventional electronic fuses are suitable for most power tool applications with maximum power output of, for example, 1500 watts or below. Such power tools may operate at an operating current limit of, for example, 20 A, and can therefore be properly protected using a small electronic fuse with a constant current rating of 30 A. Common 30 A fuses have surface areas of 3-6 mm$^2$ and thus can be suitably mounted on the PCB 202 without significant design work. However, power tools producing power output levels greater than 1500 watts usually operate at current thresholds that are greater than the 30 A constant current rating of conventional small fuses, causing the fuses the open during normal operation.

Fuses with higher current ratings are commonly available but are significantly larger than above-referenced fuses and not suitable for use in most power tools. Commercially available high-current fuses, such as those used in automotive applications (e.g., with a constant current rating of 60 A to 100 A) often require a mounting surface area of 2 cm$^2$ or greater, which represents a large portion of the electronic control module 200.

Figure 6:
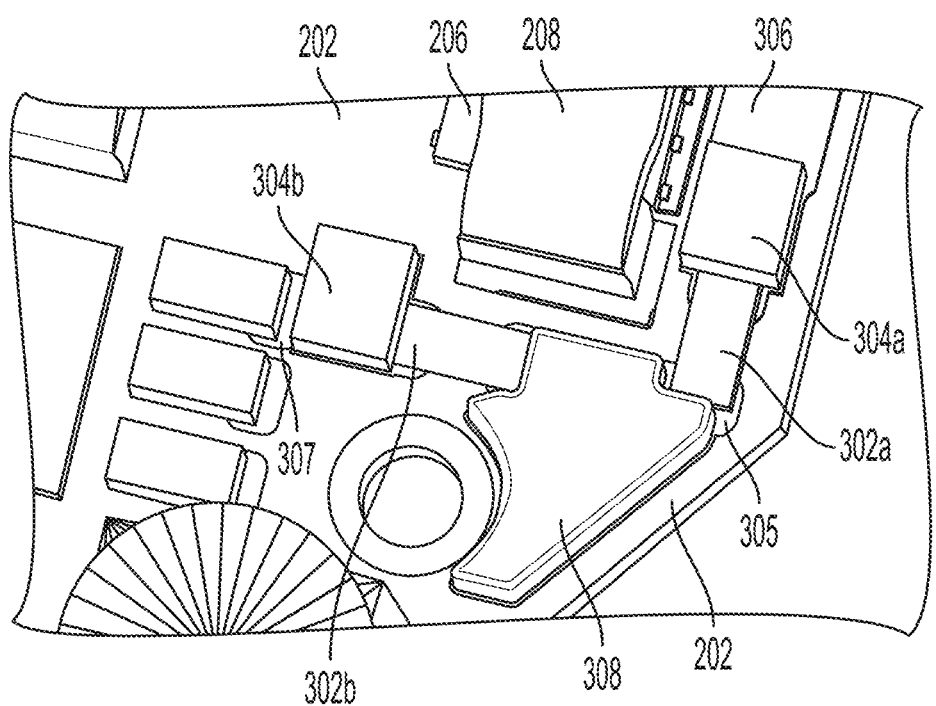
FIG. 6 depicts a perspective view of the PCB having two fuses mounted thereon with metal slugs for improved thermal protection, according to an embodiment.

One way to overcome this problem, according to an embodiment of the invention, is to provide two or more small (e.g., 30 A) fuses in parallel to provide a higher combined current rating (e.g., 60 A). FIG. 6 depicts two fuses 302a, 302b arranged in parallel. First nodes of the fuses 302a and 302b are soldered on a conductive track 305 to be commonly coupled to the B+ node of the battery pack. Second node of the fuses 302a and 302b soldered on conductive tracks 306 and 307 to be electrically connected to the high-side power switches 206. In an embodiment, conductive track 307 is commonly coupled to conductive track 306 via an internal track (not visible in this figure) extending through the PCB 202.

The combined current rating of the two fuses 302a, 302b is suitable for power tool applications with power maximum power output of greater than 1500 W. However, due to the small size of the fuses, the soldering joints of the fuses arranged in this manner melt at high current levels that are below the combined current rating but above the current rating of a single fuse. Thus, the solder joints of the fuses melt and disconnect the fuses from the PCB 202 prior to the fuses opening.

To overcome this problem, according an embodiment, a first metallic slug 308 and second metallic slugs 304a, 304b are mounted on the PCB 202 on the current path of the fuses 302a and 302b. Metal slug 308, which may be a copper slug or other metal with high thermal conductivity, mounted on conductive track 305 adjacent the solder joints of the first nodes of the fuses 302a and 30b to be on the path between the B+ battery terminal and the fuses 302a and 302b. Metal slug 308 is large enough to increase the thermal mass and carries heat away from the solder joints of the fuses 302a and 302b. In an embodiment, metal slug 308 has a surface area that is at least twice the surface area of each of the fuses 302a and 302b, and in an embodiment, larger than the combined surface area of fuses 302a and 302b.

In an embodiment, second metal slugs 304a and 304b are also copper slugs are made of other high-thermal conductivity metal, have approximately the same surface area as the fuses 302a, 302b, or greater. In an embodiment, metal slugs 304a and 304b are mounted on conductive tracks 306 and 307 adjacent solder joints of the second nodes of the fuses 302a and 302b to be on the path between the inverter bridge and the fuses 302a and 302b.

Figure 7:
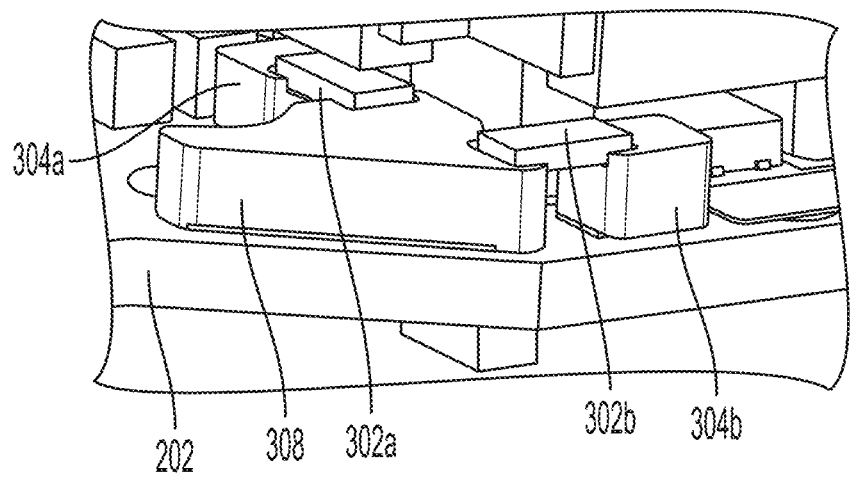
FIG. 7 depicts a perspective view of the PCB with fuses soldered on top of the metal slugs, according to an embodiment.

FIG. 7 depicts a perspective view of the PCB 202 with fuses 302a and 302b are soldered on top of the first metal slug 308 and second metal slugs 304a, and 304b, according to an embodiment. In this embodiment, the fuses are spaced apart from the PCB 202 at a height approximately corresponding to the height of the metal slugs 308, 304a, and 304b. In an embodiment, each metal slug may include a recess within each a corresponding node of the fuses 302a and 302b is disposed and soldered.

Figure 8:
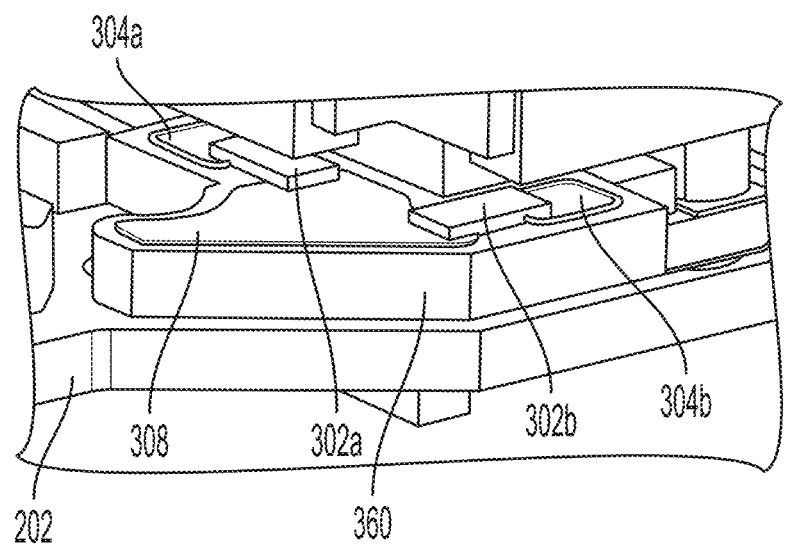
FIG. 8 depicts a perspective view of the PCB with metal slugs overmolded as a sub-assembly, according to an embodiment.

FIG. 8 depicts a perspective view of the PCB with metal slugs overmolded as a sub-assembly, according to an embodiment. In this embodiment, an overmold structure 360 is formed around the first metal slug 308 and second metal slugs 304a, and 304b, and under the fuses 302a and 302b to structurally and spatially support these components.

An alternative embodiment of the invention is described herein with reference to FIGS. 9-13.

Figure 9:
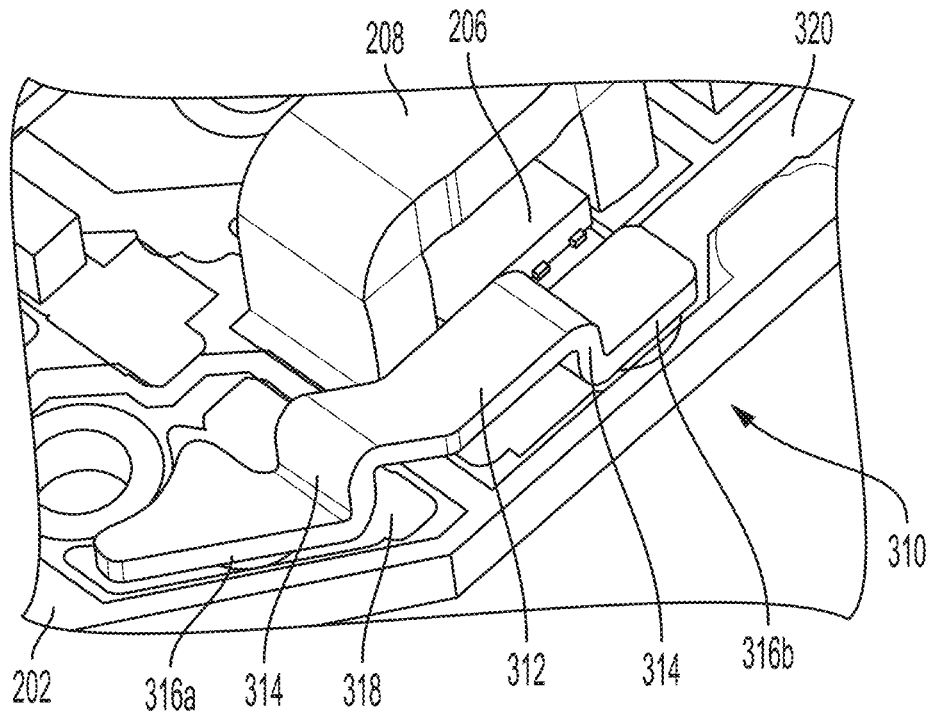
FIG. 9 depicts a perspective view of the PCB having a fuse strap in place of a conventional fuse, according to an embodiment.
Figure 10:
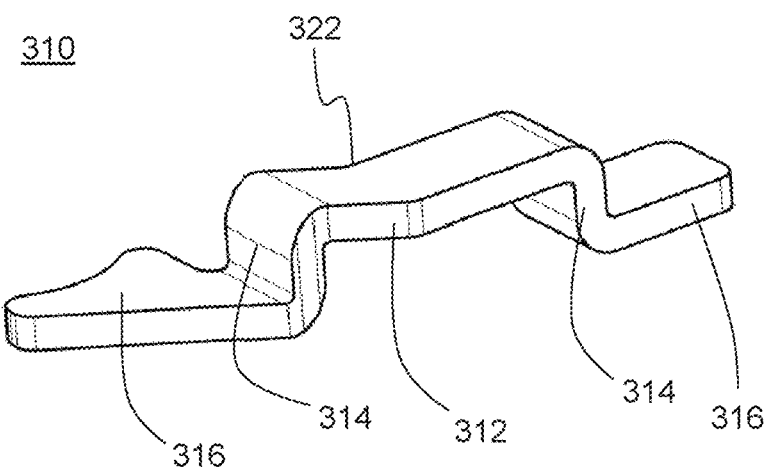
FIG. 10 depicts a perspective view of the fuse strap, according to an embodiment.

FIG. 9 depicts a partial zoomed-in perspective view of the PCB 202 of the electronic control module 200, provided with a conductive mechanical fuse element, herein referred to as a fuse strap 310, in place of a conventional electronic fuse, according to an embodiment. FIG. 10 depicts a perspective view of a fuse strap 310, according to an embodiment.

In an embodiment, fuse strap 310 includes a main body 312 extending substantially parallel to the PCB 202 forming a gap therebetween, two legs 314 extending substantially perpendicularly towards the PCB 202, and two mounting portions 316a and 316b extending laterally from ends of the legs 314 to be mounted on the PCB 202. The mounting portions 316a and 316b are soldered on top of conductive tracks 318 and 320, which are respectively electrically coupled to one of the battery terminals (e.g., B+ node of the battery pack) and the inverter bridge (e.g., the drains of the high-side power switches 206). The solder material is disposed between the mounting portions 316a, 316b, and the conductive tracks 318, 320 to secure the fuse strap 310 to the PCB 202.

In an embodiment, the solder material has a melting point of approximately 230 degrees C. Heat is generated due to resistance of the fuse strap 310 itself, the resistance of conductive tracks 318 and 320, and contact resistance of the solder connections. The melting point of the solder material corresponds to a current-time curve of the current passing through the fuse strap 310. When the current passing through the fuse strap 310 exceeds the current-time curve, i.e., when sufficiently-high current passes through the fuse strap 310 for a sufficiently long amount of time, the solder joint of the mounting portion 316a melts and disconnects the fuse strap 310 from the conductive track 318. This arrangement makes fuse strap 310 suitable as a replacement for conventional fuses for high-power and high-current power tool applications.

In an embodiment, due to the large thermal mass of the inverter bridge circuit components connected to conductive track 320 (including the high-side switches 206 and the associated heat sinks 208), heat is dissipated from the solder joint of the conductive track 320 at a faster rate compared to the solder joint of the conductive track 318. Thus, the connection between the mounting portion 316b and the conductive track 320 remains intact, even as solder joint between the mounting portion 316a and the conductive track 318 melts and disconnects the fuse strap 310.

In an embodiment, main body 312 of the fuse strap 310 is provided with a curved section 322. Curved section 322 applies a biasing force to the mounting portion 316a in a direction away from the PCB 202 to cause separation of the mounting portion 316a from the PCB 202 once the solder joint of the mounting portion 316a has melted.

Figure 11:
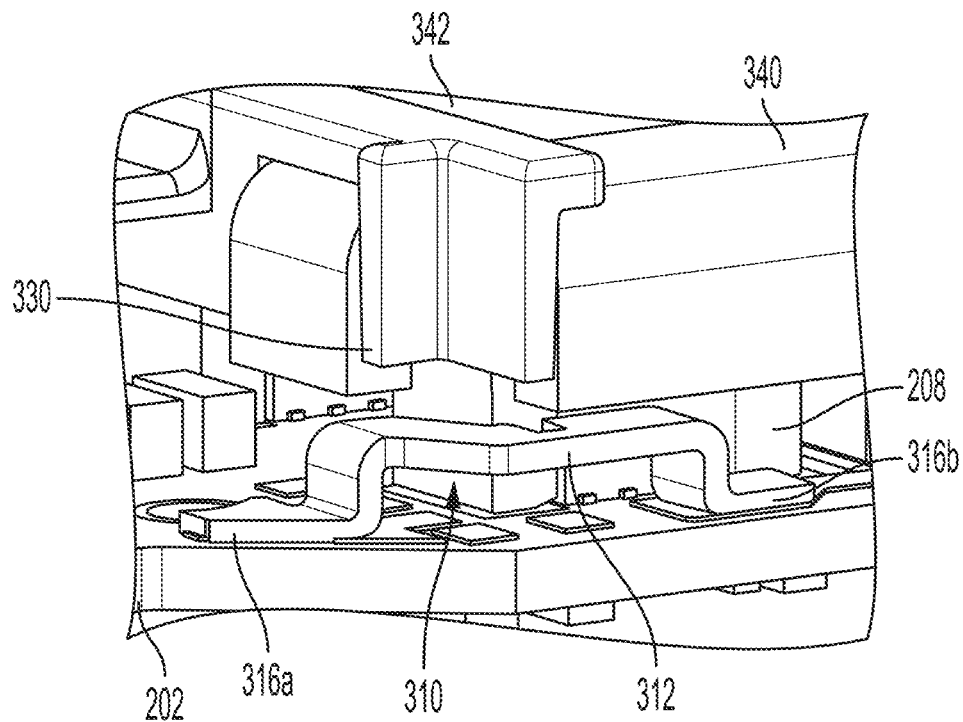
FIG. 11 depicts a magnet disposed proximate the fuse strap, according to an embodiment.

FIG. 11 depicts a perspective view of the PCB 202 where a magnet 330 is provided within the electronic control module 200 above the main body 312 of the fuse strap 310, according to an embodiment. Magnet 330 applies a magnetic force to the mounting portion 316a in a direction away from the PCB 202 to cause separation of the mounting portion 316a from the PCB 202 once the solder joint of the mounting portion 316a has melted. In an embodiment, magnet 330 may be mounted on an insulating frame 342 that secures an auxiliary heat sink 340 over the heat sinks 208 for improved thermal transfer. Reference is made to U.S. application Ser. No. 15/608,837 filed May 24, 2017, which is incorporated herein by reference in its entirety, for a detailed description of an integrated auxiliary heatsink as an example. In an embodiment, magnet 330 may be secured to a lower end of the insulating frame 342 or the auxiliary heat sink 340 in close proximity to the main body 312 of the fuse strap 310.

Figure 12:
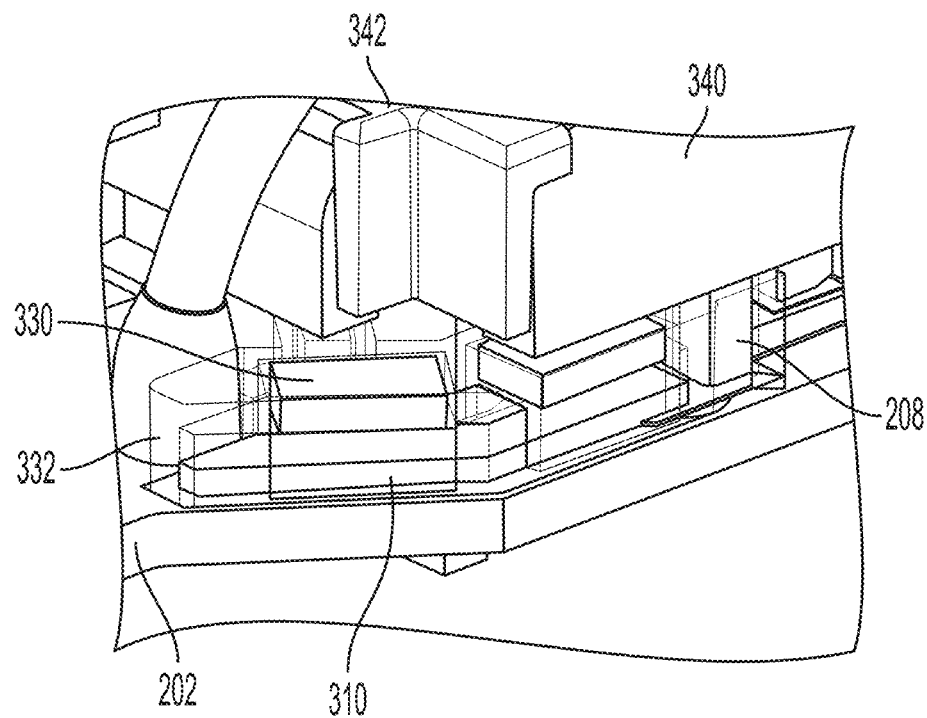
FIG. 12 depicts the magnet held via a support structure relative to the fuse strap, according to an embodiment.

FIG. 12 depicts a perspective view of the PCB 202 in which magnet 330 is secured with respect to the fuse strap 310 via a support structure 332. Support structure 332, which is shown herein translucently to expose the fuse strap 310 and the magnet(s) 330, is in an embodiment an overmolded structure mounted on the PCB 202 around the fuse strap 310. The support structure 332 includes walls forms around the fuse strap 310 and a ceiling that supports the magnet(s) 330 relative to the fuse strap 310, forming a gap between the fuse magnet(s) 330 between the fuse strap 310.

While these examples utilize a magnet 330 to bias the fuse strap 310 away from the PCB 202, other biasing members may alternatively be used. Examples include, but are not limited to, a compression spring disposed between the main body 312 of the fuse strap 310 and the PCB 202, a torsion spring disposed between the main body 312 of the fuse strap 310 and the insulating frame 342, etc.

Figure 13:
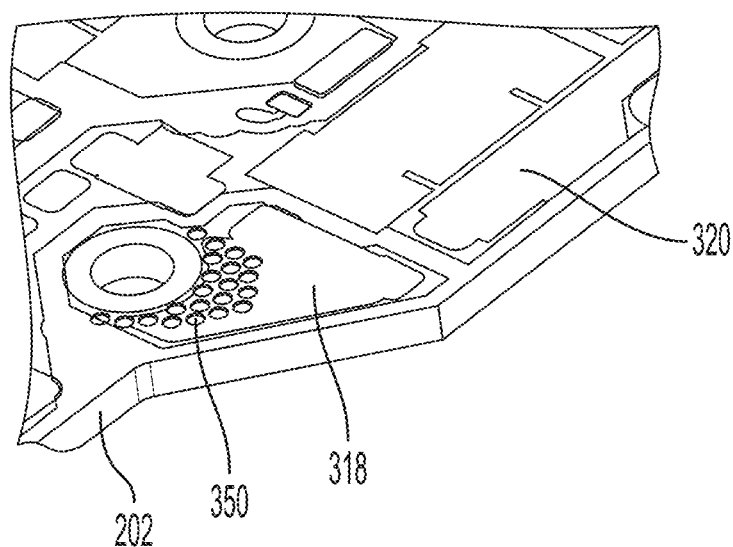
FIG. 13 depicts through-holes disposed within the PCB on the mounting area of the fuse strap for absorbing the solder material, according to an embodiment.

FIG. 13 depicts a perspective view of the PCB 202 with the fuse strap 310 removed. As shown herein, a series of though-hole vias 350 are provided though the conductive track 318, particularly on the mounting area of the mounting portion 316a of the fuse strap 310. When the solder melts, it flows into the vias 350 away from the mounting portion 316a of the fuse strap 310, ensuring that the fuse strap 310 electrically disconnects from the conductive track 318.

Figure 14:
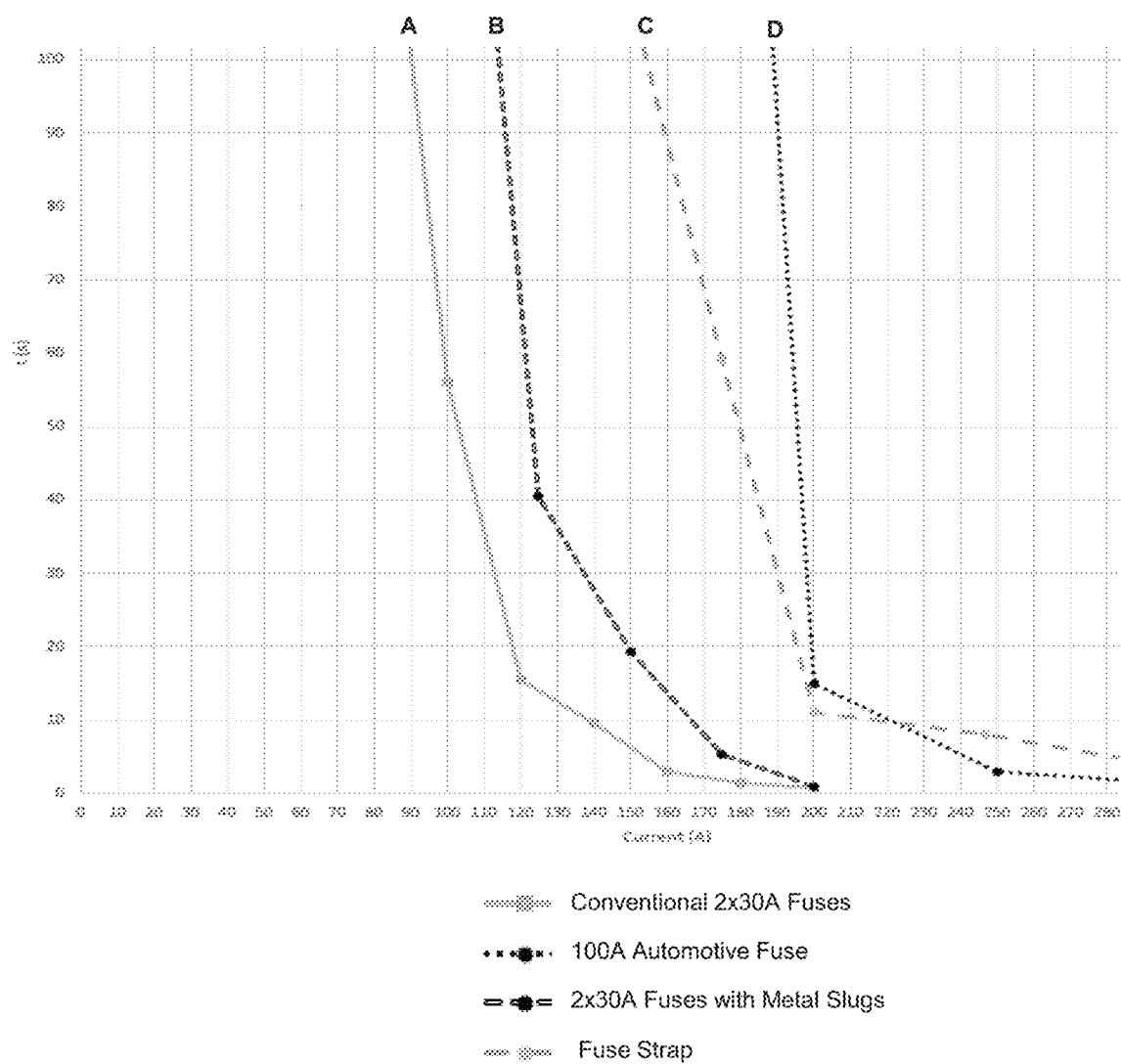
FIG. 14 depicts a current-time diagram of different fuses, according to an embodiment.

FIG. 14 depicts an exemplary current-time waveform diagram showing current-time profiles of A) two conventional 30A fuses in parallel, B) two conventional 30A fuses in parallel with metal slugs, C) fuse strap, and D) a conventional 100A automotive fuse. The current-time profile represents the limit of current applied for a given amount of time before the fuse opens and disconnects the battery pack from the inverter bridge. As seen here, the fuse strap 310 provides a sufficiently high current-time profile comparable to conventional automotive fuses at a fraction of the size. In an embodiment, fuse strap 310 includes occupies a total surface area of 50-100 mm2, preferably 60-90 mm2.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The invention claimed is:

1. An electronic module for a power tool having an electric motor, comprising:
   a printed circuit board (PCB);
   an inverter bridge circuit including a plurality of power switches mounted on the PCB and configured to switchably supply electric power from a power source to the electric motor;
   a first conductive track disposed on the PCB and coupled to the power source;
   a second conductive track disposed on the PCB and coupled to the inverter bridge circuit;
   a fuse strap provided between the first conductive track and the second conductive track, the fuse strap having a main body spaced apart from the PCB, a first mounting portion mounted on the first conductive track via a first solder joint, and a second mounting portion mounted on the second conductive track via a second solder joint; and
   a plurality of through-hole vias provided through the first conductive track and at least partially through the PCB, wherein, when current through the fuse strap exceeds a current threshold for a set amount of time, the first solder joint melts and flows into the plurality of through-hole vias away from the first mounting portion to allow the first mounting portion to detach from the first conductive track.

2. The electronic module of claim 1, wherein the second solder joint continues to bond the second mounting portion to the second conductive track after the first mounting portion detaches from the first conductive track.

3. The electronic module of claim 1, wherein the first mounting portion has a greater surface area than the second mounting portion.

4. The electronic module of claim 1, wherein the fuse strap has a total surface area of smaller than or equal to 100 mm^2 but is capable of sustaining current greater than 150 Amps for up to approximately 100 seconds.

5. The electronic module of claim 1, wherein the main body of the fuse strap includes a curved portion configured to apply a biasing force to the first mounting portion in a direction away from the PCB.

6. The electronic module of claim 1, further comprising a magnet provided at a distance from the fuse strap to apply a magnetic force to the first mounting portion in a direction away from the PCB.

7. The electronic module of claim 6, further comprising an insulating frame disposed above the PCB configured to support the magnet.

8. The electronic module of claim 1, wherein the motor is a brushless DC motor configured to output at least 1500 watts of power and the power source is a removable power tool battery pack.

9. An electronic module for a power tool having an electric motor, comprising:
   a printed circuit board (PCB);
   an inverter bridge circuit including a plurality of power switches mounted on the PCB and configured to switchably supply electric power from a power source to the electric motor;
   a first conductive track disposed on the PCB and coupled to the power source;
   a second conductive track disposed on the PCB and coupled to the inverter bridge circuit;
   a fuse strap provided between the first conductive track and the second conductive track, the fuse strap having a main body spaced apart from the PCB, a first mounting portion mounted on the first conductive track via a first solder joint, and a second mounting portion mounted on the second conductive track via a second solder joint; and
   a magnet provided at a fixed distance from the circuit board to apply a magnetic force to the first mounting portion in a direction away from the PCB, wherein, when current through the fuse strap exceeds a current threshold for a set amount of time, the first solder joint melts and the magnet forces the first mounting portion to detach from the first conductive track.

10. The electronic module of claim 9, wherein the second solder joint continues to bond the second mounting portion to the second conductive track after the first mounting portion detaches from the first conductive track.

11. The electronic module of claim 9, wherein the first mounting portion has a greater surface area than the second mounting portion.

12. The electronic module of claim 9, wherein the fuse strap has a total surface area of smaller than or equal to 100 mm^2 but is capable of sustaining current greater than 150 Amps for up to approximately 100 seconds.

13. The electronic module of claim 9, further comprising an insulating frame disposed above the PCB configured to support the magnet.

14. The electronic module of claim 9, further comprising a plurality of through-hole vias provided through the first conductive track and at least partially through the PCB, wherein, when current through the fuse strap exceeds a current threshold for a set amount of time, the first solder joint melts and flows into the plurality of through-hole vias to allow the first mounting portion to detach from the first conductive track.

15. The electronic module of claim 9, wherein the motor is a brushless DC motor configured to output at least 1500 watts of power and the power source is a removable power tool battery pack.

\* \* \* \* \*